United States Patent
Poppe et al.

(10) Patent No.: US 9,496,853 B2
(45) Date of Patent: Nov. 15, 2016

(54) VIA RESISTANCE ANALYSIS SYSTEMS AND METHODS

(75) Inventors: Wojciech Jakub Poppe, San Jose, CA (US); Puneet Gupta, San Jose, CA (US); Ilyas Elkin, Sunnyvale, CA (US)

(73) Assignee: NVIDIA CORPORATION, Santa Clara, CA (US)

(*) Notice: Subject to any disclaimer, the term of this patent is extended or adjusted under 35 U.S.C. 154(b) by 0 days.

(21) Appl. No.: 13/556,129

(22) Filed: Jul. 23, 2012

(65) Prior Publication Data

US 2013/0021107 A1 Jan. 24, 2013

Related U.S. Application Data

(63) Continuation-in-part of application No. 13/528,725, filed on Jun. 20, 2012.

(60) Provisional application No. 61/511,021, filed on Jul. 22, 2011, provisional application No. 61/512,362, filed on Jul. 27, 2011, provisional application No. 61/513,508, filed on Jul. 29, 2011.

(51) Int. Cl.
*H03K 3/03* (2006.01)
*G01R 31/317* (2006.01)
(Continued)

(52) U.S. Cl.
CPC ....... *H03K 3/0315* (2013.01); *G01R 31/31725* (2013.01); *H01L 22/34* (2013.01); *G01R 31/2831* (2013.01); *H01L 2924/0002* (2013.01)

(58) Field of Classification Search
CPC .... G01R 27/00; G01R 27/02; G01R 29/027; G01R 29/0273; G01R 31/3016; G01R 31/31725–31/31727; G01R 31/31937; H03B 27/00; H03K 3/0315; H03K 3/0322; H01L 7/0995
USPC .......... 324/617, 691, 707; 327/161; 331/44, 331/45, 57, 105; 702/58, 64, 65, 79, 89, 702/117, 124, 125, 176
See application file for complete search history.

(56) References Cited

U.S. PATENT DOCUMENTS

| | | |
|---|---|---|
| 4,922,140 A | 5/1990 | Gahle et al. |
| 5,553,276 A | 9/1996 | Dean |

(Continued)

FOREIGN PATENT DOCUMENTS

| | | |
|---|---|---|
| CN | 101144741 A | 3/2008 |
| CN | 102098028 A | 6/2011 |

(Continued)

OTHER PUBLICATIONS

Basab Datta et al., "Analysis of a Ring Oscillator Based on Chip Thermal Sensor in 65nm Technology", VLSI Design Principles (ECE 658) Lab 4 Project, University of Massachusetts-Amherst, Dec. 23, 2005.

(Continued)

*Primary Examiner* — Levi Gannon

(57) ABSTRACT

Component characteristics analysis systems and methods are described. In one embodiment, a ring oscillator comprises: at least one inversion stage operable to cause a signal transition; a target component that has an increased comparative impact or influence on a signal transition propagation in the ring oscillator; and an output component for outputting an indication of the impact the target component has on the signal transition. The target component can include a plurality of vias from one metal layer to another metal layer, which can be configured in a cell. The vias can correspond to a via layer. In one exemplary implementation, the output is coupled to an analysis component. The analysis component can include correlation of the via resistance into a wafer variations and generate a wafer map and can include correlation of the via resistance into a wafer.

20 Claims, 15 Drawing Sheets

(51) Int. Cl.
*H01L 21/66* (2006.01)
*G01R 31/28* (2006.01)

(56) References Cited

U.S. PATENT DOCUMENTS

| | | | |
|---|---|---|---|
| 5,835,553 A | | 11/1998 | Suzuki |
| 5,973,507 A | | 10/1999 | Yamazaki |
| 6,023,430 A | | 2/2000 | Izumikawa |
| 6,242,960 B1 | | 6/2001 | Bae |
| 6,401,018 B1 | | 6/2002 | Oba et al. |
| 6,535,013 B2 | | 3/2003 | Samaan |
| 6,535,071 B2 | | 3/2003 | Forbes |
| 6,724,225 B2 | | 4/2004 | Joshi et al. |
| 6,801,096 B1 | * | 10/2004 | Nariman et al. ............... 331/57 |
| 6,854,100 B1 | | 2/2005 | Chuang et al. |
| 6,882,172 B1 | | 4/2005 | Suzuki et al. |
| 6,998,901 B2 | | 2/2006 | Lee |
| 7,064,620 B1 | * | 6/2006 | Lai et al. ..................... 331/45 |
| 7,085,658 B2 | * | 8/2006 | Bhushan et al. ............... 702/57 |
| 7,151,417 B1 | | 12/2006 | Suzuki |
| 7,180,794 B2 | | 2/2007 | Matsue |
| 7,282,975 B2 | | 10/2007 | Burton et al. |
| 7,315,221 B2 | | 1/2008 | Ha et al. |
| 7,332,937 B2 | | 2/2008 | Hsu et al. |
| 7,365,611 B2 | * | 4/2008 | Ikeda et al. ................... 331/44 |
| 7,489,204 B2 | * | 2/2009 | Habitz et al. ................. 331/44 |
| 7,535,128 B2 | | 5/2009 | Wang et al. |
| 7,550,998 B2 | | 6/2009 | Brazis et al. |
| 7,592,876 B2 | | 9/2009 | Newman |
| 7,642,864 B2 | | 1/2010 | Chuang et al. |
| 7,760,033 B2 | | 7/2010 | Podmanik et al. |
| 7,795,927 B2 | | 9/2010 | Farwell |
| 7,804,372 B2 | | 9/2010 | Nakatani |
| 7,868,706 B2 | | 1/2011 | Nissar et al. |
| 7,908,109 B2 | * | 3/2011 | Good et al. .................... 702/117 |
| 8,041,518 B2 | * | 10/2011 | McIntyre et al. .............. 702/57 |
| 8,081,035 B2 | * | 12/2011 | Wood ............................. 331/45 |
| 8,143,919 B2 | | 3/2012 | Kurokawa |
| 8,193,833 B2 | | 6/2012 | Inukai |
| 8,247,906 B2 | | 8/2012 | Law et al. |
| 8,378,754 B2 | | 2/2013 | Yamamoto |
| 2003/0001185 A1 | | 1/2003 | Sell et al. |
| 2003/0034848 A1 | | 2/2003 | Norman et al. |
| 2005/0007154 A1 | | 1/2005 | Patella et al. |
| 2005/0012556 A1 | | 1/2005 | Bhushan et al. |
| 2006/0028241 A1 | | 2/2006 | Apostol et al. |
| 2006/0161797 A1 | | 7/2006 | Grass et al. |
| 2006/0178857 A1 | | 8/2006 | Barajas |
| 2007/0273450 A1 | | 11/2007 | Burton et al. |
| 2008/0094053 A1 | | 4/2008 | Han et al. |
| 2009/0045834 A1 | | 2/2009 | Farwell |
| 2009/0096495 A1 | | 4/2009 | Keigo |
| 2010/0102891 A1 | | 4/2010 | Nissar et al. |
| 2010/0189160 A1 | | 7/2010 | Kim et al. |
| 2010/0327983 A1 | * | 12/2010 | Yamamoto ..................... 331/57 |
| 2011/0101998 A1 | | 5/2011 | Myers et al. |
| 2013/0027140 A1 | * | 1/2013 | Poppe et al. ................... 331/57 |
| 2013/0106438 A1 | | 5/2013 | Elkin et al. |
| 2013/0106524 A1 | | 5/2013 | Elkin et al. |
| 2013/0110437 A1 | | 5/2013 | Singh et al. |

FOREIGN PATENT DOCUMENTS

| | | |
|---|---|---|
| DE | 102004001668 A1 | 8/2005 |
| DE | 102006005848 A1 | 8/2006 |
| DE | 102004001668 B4 | 9/2007 |
| DE | 10063996 B4 | 6/2009 |
| KR | 10-2001-0035660 A | 5/2001 |
| TW | 200403779 A | 3/2004 |
| TW | 200419688 A | 10/2004 |
| TW | 200943719 A | 10/2009 |
| TW | 201103116 A | 1/2011 |
| TW | 201118392 A | 6/2011 |

OTHER PUBLICATIONS

Klass, Fabian; "Design for Yield Using Statistical Design," EE380 Computer Systems Colloquium, Stanford University, Feb. 7, 2007.
Harshada Vinayak Khare, "Design of an On-Chip Thermal Sensor using Leakage Current of a Transistor", Jan. 2010 Thesis University of Minnesota.

* cited by examiner

1100

| 1110 |
| --- |
| A dominate characteristic ring oscillation process is performed. |

| 1120 |
| --- |
| An analysis process is performed. |

```
1210
An indication associated with a dominant
characteristic is received.
```

```
1220
A transition delay time is determined,
wherein the transition delay time is impacted
by a dominant characteristic.
```

```
1220
A transition delay time is determined,
wherein the transition delay time is impacted
by a dominant characteristic.
```

FIG 12

VIA RESISTANCE ANALYSIS SYSTEMS AND METHODS

RELATED APPLICATIONS

This application claims benefit of and priority to:
Application No. 61/511,021 entitled "Digital Extraction of Via Resistance and Failure Rate" filed on Jul. 22, 2011;
Application No. 61/512,362 entitled "Digital Extraction of Metal Resistance and Capacitance" filed on Jul. 27, 2011;
Application No. 61/513,508 entitled "Digital Extraction of Via Resistance and Failure Rate" filed on Jul. 29, 2011;
Application Ser. No. 13/528,725 entitled "Coupling Resistance and Capacitance Analysis Systems and Methods" filed on Jun. 20, 2012; and
which are incorporated herein by reference. This Application is a continuation-in-part of prior application Ser. No. 13/528,725 entitled "Coupling Resistance and Capacitance Analysis Systems and Methods" filed on Jun. 20, 2012 which claims the benefit of:
Application No. 61/511,021 entitled "Digital Extraction of Via Resistance and Failure Rate" filed on Jul. 22, 2011;
Application No. 61/512,362 entitled "Digital Extraction of Metal Resistance and Capacitance" filed on Jul. 27, 2011; and
Application No. 61/513,508 entitled "Digital Extraction of Via Resistance and Failure Rate" filed on Jul. 29, 2011.

FIELD OF THE INVENTION

The present invention relates to examining semi-conductor chip component operations. In particular, the present invention relates to systems and methods for examining impacts associated component characteristics and features.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. The manner in which the electronic devices perform operations can have a significant impact on the performance and end results. However, traditional attempts at accurately analyzing impacts associated with different aspects of how a device operates are often limited and can be very complex and complicated.

As process dimensions shrink (e.g., with advancing semi-conductor process generation, etc.), it usually becomes more and more difficult to consistently reproduce the same exact pattern. Process variability can cause significant yield fallout leading to wasted silicon. Via and contact variations are a significant cause of yield loss as they are very challenging to print and typically require very fine alignment between metal and via/contact layers. Via resistance measurement structures have been designed and implemented, but past traditional approaches generally require an analog resistance measurement (e.g., directly by oscilloscope, through a four-point probe approach, other methods, Kelvin techniques, etc.) or are very limited digital attempts (e.g., zero or infinite resistance, only detect opens, etc.) and usually involve extremely large number of vias (e.g., million vias, etc.). Since each wafer can have hundreds of chips and multiple via layers (e.g., up to a dozen or more, etc.), traditional attempts at more detailed or exhaustive measurement is usually very difficult and can involve signification costs.

SUMMARY

Component characteristics analysis systems and methods are described. In one embodiment, a ring oscillator comprises: at least one inversion stage operable to cause a signal transition; a target component that has an increased comparative impact or influence on a signal transition (e.g., change, propagation, etc.) propagation in the ring oscillator; and an output component for outputting an indication of the impact the target component has on the signal transition. The target component can include a plurality of vias from one metal layer to another metal layer. The plurality of vias from one metal layer to another metal layer can be configured in a cell. The vias can correspond to a via layer. In one exemplary implementation, the output is coupled to an analysis component. The analysis component can include correlation of the via resistance into wafer variations and generate a wafer map. The analysis component can include correlation of the via resistance into a wafer.

In one embodiment a method comprises: performing a dominant characteristic ring oscillation process; and analyzing results of the dominant characteristic ring oscillation process. The analysis can include determining a delay associated with a via resistance characteristic of a dominant characteristic ring oscillation process.

The analysis can include correlating a delay associated with at least one of the dominant via resistance characteristic oscillation rings to a process variation. The analysis can include deconvolving (e.g., transistor speed, metal resistance, etc.).

DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 11 is a flow chart of exemplary analysis method in accordance with one embodiment of the present invention.

FIG. 12 is a flow chart of an exemplary analysis process in accordance with one embodiment of the present invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present systems and methods facilitate analysis of characteristics of various components (e.g., via resistance, contact resistance, etc.) and the characteristics can be utilized in various other analysis (e.g., manufacturing analysis, process analysis, etc.). In one embodiment, a novel characteristic dominated ring oscillator system includes a component or type of component (e.g., via resistances, contact resistances, etc.) that has an increased comparative impact or influence on a signal propagation in the ring oscillator (e.g., timing, delay, etc.). The resulting frequency can be analyzed for indications of the dominant component characteristics or features which can be utilized to determine indications of fabrication and operation problems. It is appreciated that a dominant characteristic component can impact or influence a the signal transition propagation in a variety of ways. A dominant characteristic can impact a propagation of a signal transition from one component to another component. In one embodiment, a dominant characteristic component (e.g., via resistances, contact resistances, etc.) is coupled to the path of a ring oscillator. A dominant characteristic can impact signal transition changes from one state to another state (e.g., logical 0, logical 1, low voltage, high voltage, etc.). In one embodiment, a dominant characteristic component (e.g., via resistances, contact resistances, etc.) is coupled to the power supply path to inversion components of a ring oscillator. Additional information regarding dominant characteristic ring oscillators and analysis of the delay indications is set forth in following sections of the detailed description.

Figure 1:
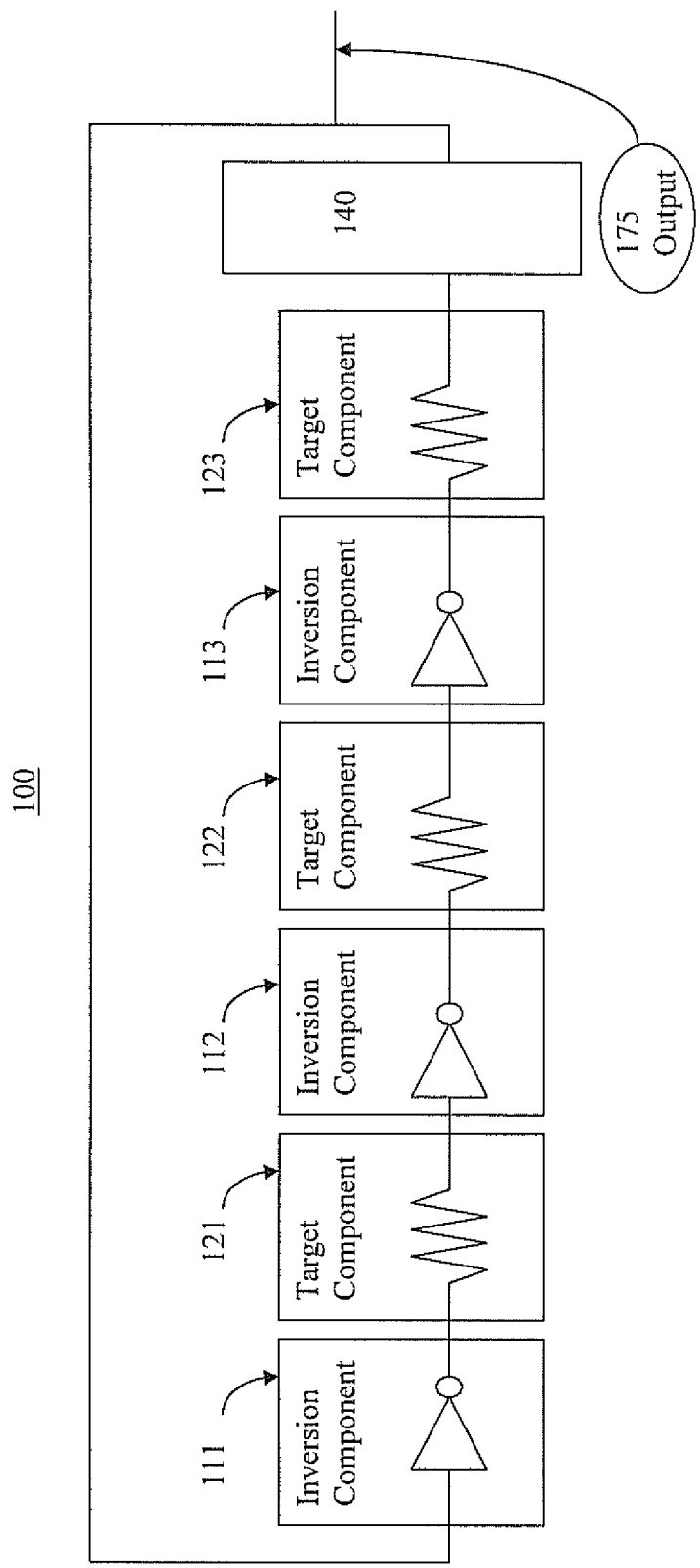
FIG. 1 is a block diagram of an exemplary characteristic dominated ring oscillator in accordance with one embodiment of the present invention.

FIG. 1 is a block diagram of exemplary characteristic dominated ring oscillator 100 in accordance with one embodiment of the present invention. Characteristic dominated ring oscillator 100 includes inversion component 111, inversion component 112, inversion component 113, target component 121, target component 122, target component 123, control component 140 and output 175. The inversion components are operable to cause at least one respective inversion transition in a signal. The transition or propagation of the inversion in the signal to a subsequent inversion component is impacted (e.g., delayed, etc.) by the respective "dominant" characteristics of target components 121, 122 and 123. In one embodiment, the target components (e.g., vias, contacts, etc.) include an increased or dominant resistive characteristic (e.g., increased via resistance, increased contact resistance, etc.). Control component 140 is operable to control a state of the signal. Output 175 is operable to output a signal.

In one embodiment, the dominant characteristic of a target component (e.g., via resistance, contact resistance, etc.) has an increased or greater comparative impact or influence on a signal transition or propagation (e.g., timing, delay, etc.) than another component (e.g., inversion component, control component, etc.). In one exemplary implementation, the increased impact influences the resulting output frequency. In one exemplary implementation, the greater or higher the resistance of a target component as compared to the resistance of another component (e.g., inversion component, control component, etc.) the greater or more proportionally significant the impact of the target component on the delay of a signal transition as compared to the other component resistance (e.g., inversion component resistance, control component resistance, etc.). In one embodiment, dominant target components in a particular oscillating ring are a homogenous type (e.g., via layer 2, via layer 3, metal layer 2, etc,).

In one embodiment, one innovative aspect includes adding a relatively high resistance load (e.g., via resistance, contact resistance, etc.) to target components or coupling components between other components (e.g., inverting stages, control components, etc.) of a ring oscillator. In one exemplary implementation, a coupling resistance load between the components or stages of the ring oscillator includes increasing the number of vias included in a coupling path of the dominant characteristic ring oscillator (e.g., more vias in a coupling path between two inverting stages, etc.). The vias can be are added until the resistance associated with the vias has a dominant or increased impact on frequency changes associated with the ring oscillator path.

Figure 2:
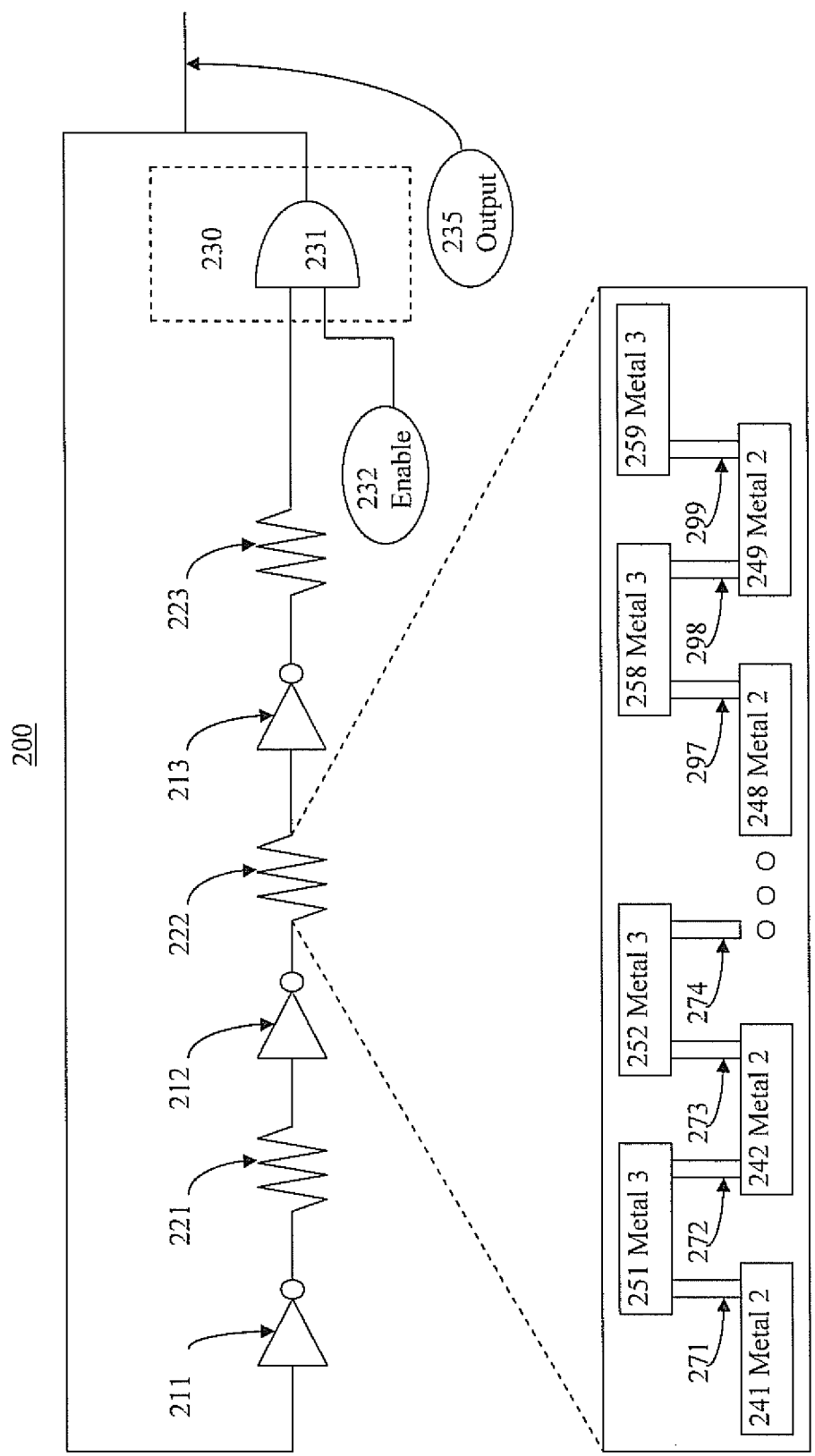
FIG. 2 is a block diagram of exemplary characteristic dominated ring oscillator in accordance with one embodiment of the present invention.

FIG. 2 is a block diagram of exemplary via resistance dominated ring oscillator 200 in accordance with one embodiment of the present invention. Via resistance dominant ring oscillator 200 includes inversion component 211, inversion component 212, inversion component 213, via resistance dominant component 221, via resistance dominant component 222, via resistance dominant component 223, control component 230 and output 235. The inversion components are operable to cause at least one respective inversion transition in a signal. The via resistance dominant components couple the respective inversion components and propagate a signal between the respective inversion components. The transition or propagation (e.g., timing, delay, etc.) of the inversion in the signal to a subsequent inversion component is impacted by the respective dominant characteristic of the via resistance dominant coupling components (e.g., 221, 222, 223, etc.). Control component 230 is operable to control a state of the signal. In one embodiment, control component includes an AND gate 231 that is coupled to enable signal 232. Output 235 is operable to output a signal.

In one embodiment, the "additional" vias (e.g., 271, 272, 273, 274, 297, 298, 299, etc.) from one metal layer component (e.g., 241, 242, 248, 249, etc.) to another metal layer component (e.g., 251, 252, 258, 259, etc.) are included between two sequential inversion components (e.g., 212, 223, etc.). While "additional" vias are included between inversion components 212 and 213, it is appreciated that "additional" vias can be included between other components also (e.g., 211 and 212, 213 and 230, etc.). In one embodiment, the dominant via connections are between metal layers M2 and M3. In one exemplary implementation, the ring oscillator (RO) inverter stage connections traverse through a single type of via (e.g., a single via layer, via2 layer, etc.). The RO inverter stage connections can also traverse through a variety of via types (e.g., multiple via layers, etc.). In one embodiment, vias included in one metal later form the dominant via resistance and vias in other metal layers have a negligible impact on the via resistance to a signal transition propagation.

In one embodiment, the target components (e.g., connections, vias, contacts, etc.) between the RO inverter stages are significantly more resistant (e.g., 100 times, 500 times, 1000 times, etc.) than the resistance of other aspects of the RO inverter stages (e.g., transistors, etc.). In one embodiment, when the via or contact resistive load is significantly higher than the resistance of channel resistance of a driving transistor, the ring oscillator frequency can be more a function of via/contact chain resistance and not transistor speed. It is possible that transistor speed variation will not even need to be factored out. In one embodiment, a inversion component includes a low channel resistance driver. As the transistor speed becomes insignificant, the frequency can be more directly and consistently translated into via or contact resistance. In one embodiment in which one type of via or contact constitutes the dominant portion of the total resistance of an RO, the via or contact dominant RO can be used to digitally measure via or contact resistance on every chip.

Figure 3:
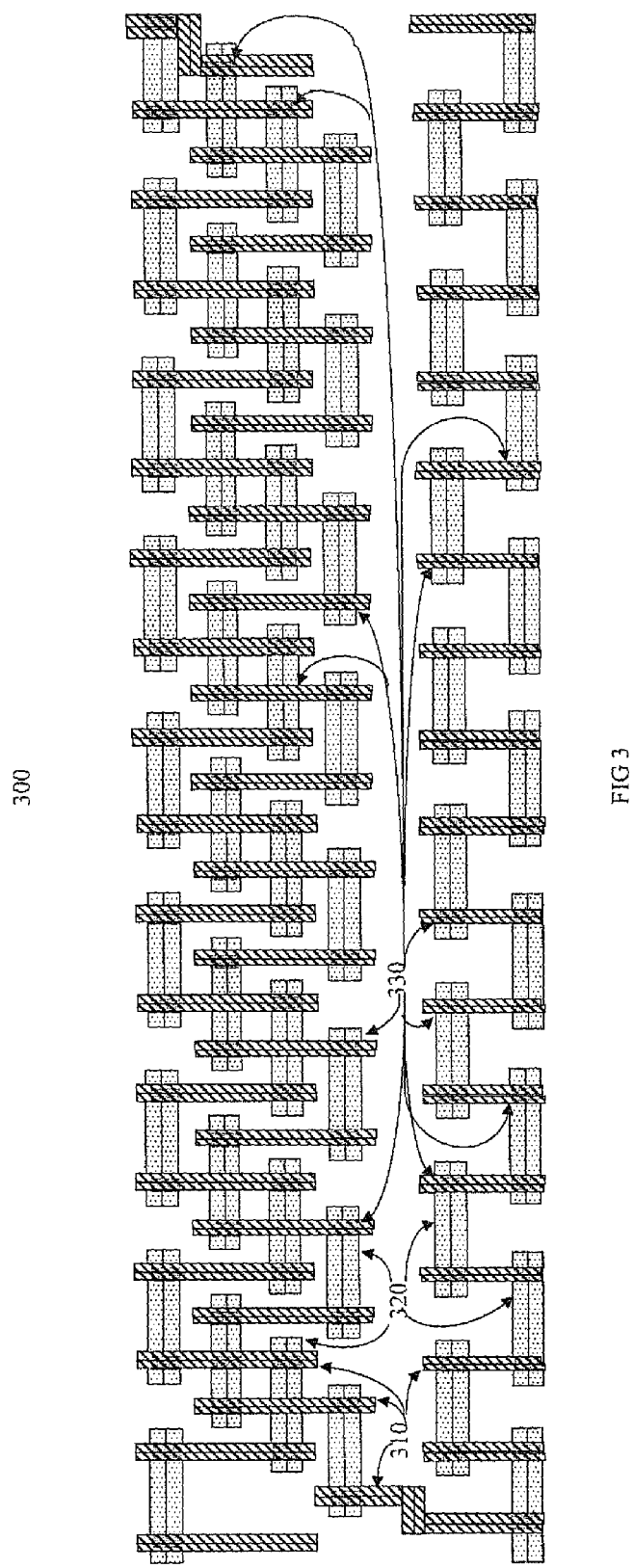
FIG. 3 is a block diagram of a cell in accordance with one embodiment of the present invention.

In one embodiment, the via connections are organized in cells with a plurality of vias (e.g., 100, 250, etc.) included in a cell. FIG. 3 is a top view block diagram of an exemplary cell in accordance with one embodiment of the present invention. The cell includes metal components shown typically as 320 in one metal layer and metal components shown typically as 310 in another metal layer that are selectively coupled by vias shown typically as 330. In one exemplary implementation, the metal components 320 in one metal layer are oriented in a first direction (e.g., parallel to a first side of a die, diagonal from the first side of a die, etc.) and the metal components 330 are oriented in an orthogonal direction from the first direction. A plurality (e.g., 2, 3, 4, etc.) of these cells can be strung between each stage, so each inverter drives through a via layer (e.g., via 2, via 3, etc.) multiple times (e.g., 200, 250, 300, etc.) in series.

Figure 4:
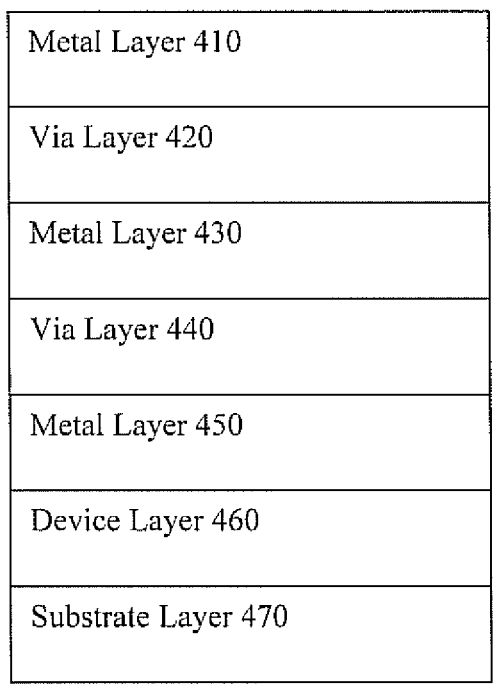
FIG. 4 is a block diagram of side view through a portion of an integrated circuit in accordance with one embodiment of the present invention.

FIG. 4 is a block diagram of side view through a portion of an integrated circuit in accordance with one embodiment of the present invention. The circuit includes a metal layer 410, a via layer 420, a metal layer 430, a via layer 440, a metal layer 450, a device layer 460, and a substrate layer 470.

The "additional" resistance between RO inverter stages (e.g., via2 level resistance, etc.) can increase the stage delay (e.g., 10 times, 20 times, etc.). In one embodiment, approximately 90% of the delay can come from or be attributed to the via2 resistance between RO inverter stages. In one exemplary implementation, a 10% change in transistor (TX) speed changes the frequency by 1% and a 10% change in via resistance changes the frequency by 9%.

In one exemplary implementation, a RO is designed to oscillate at frequency limited by Via 2 resistance in which the inverter channel resistance is approximately 200 ohms (NOTE: not counting contact/metal resistance) and the inverter stage delay is approximately 10 ps (the 3× Via chain cell resistance (e.g., 300 Via2s) is approximately 25,000 ohms) and the Via2 RO stage delay is approximately 100 ps. In one exemplary implementation, via resistance is dominant and the RO frequency correlates with Via 2 resistance.

Figure 13:
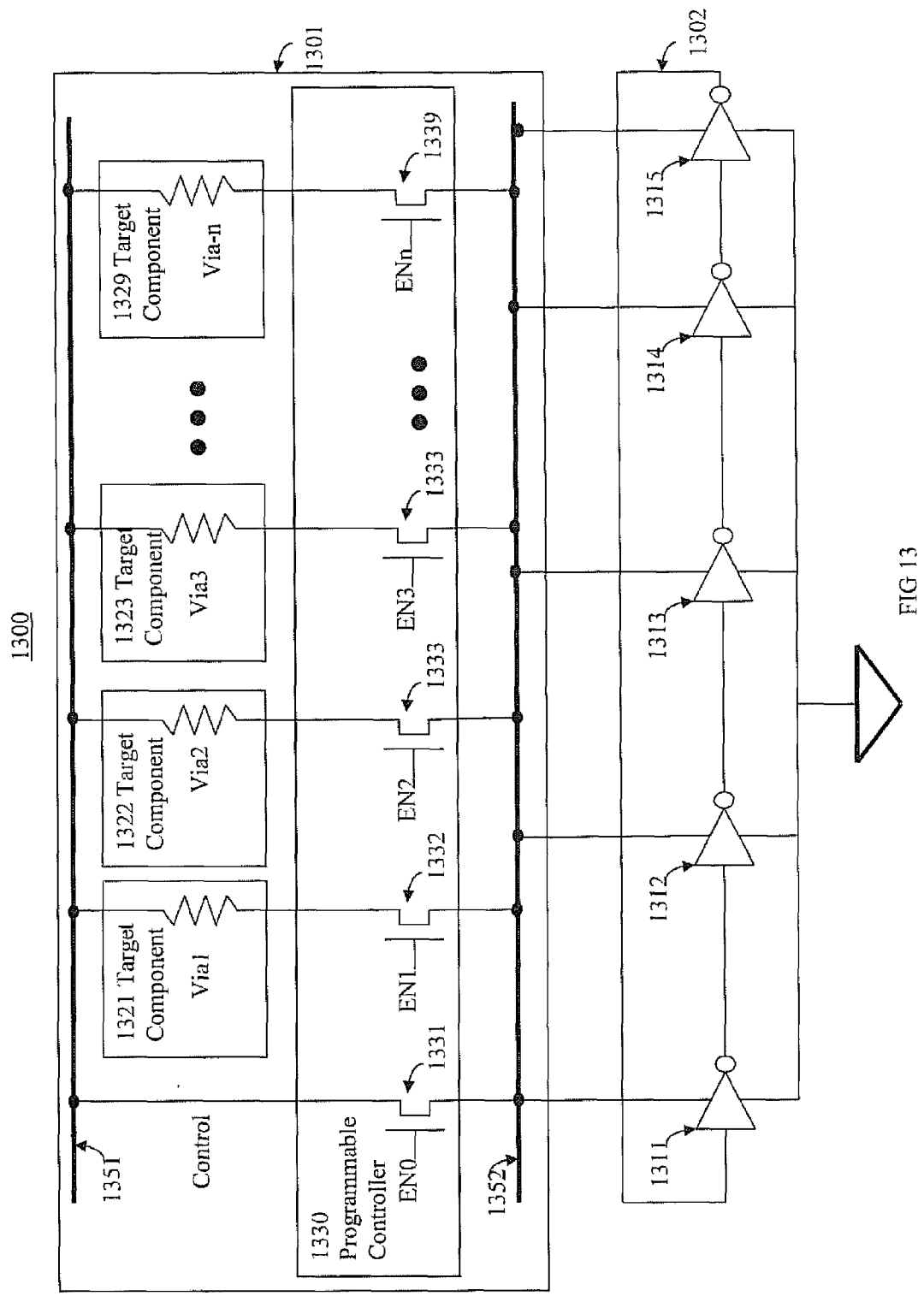
FIG. 13 is a block diagram of exemplary a characteristic dominated ring oscillator system in accordance with one embodiment of the present invention.

In one embodiment, dominant characteristic impacts a power supplied to a component of a ring oscillator which in turn impacts a signal transition in the ring oscillator. In one exemplary implementation, a dominant characteristic component (e.g., via resistances, contact resistances, etc.) is coupled in the path of the power supply path to inversion components of a ring oscillator. FIG. 13 is a block diagram of exemplary characteristic dominated ring oscillator system 1300 in accordance with one embodiment of the present invention. Characteristic dominated ring oscillator system 1300 includes power supply system 1301 and oscillating ring 1302. Power supply system 1301 includes rail 1351, target component 1321, target component 1322, target component 1323, target component 1329, programmable controller 1330 and rail 1352. Ring oscillator 1301 includes inversion components 1311, 1312, 1313 1314 and 1315. It is appreciated that a ring oscillator can have various odd numbers (e.g., 3, 5, 7, etc.) of inversion components. In one embodiment, ring oscillator 1302 can include a control component (not shown) is operable to control a state of the signal (e.g., similar to control component 140, etc.) and an output operable to output a signal (e.g., similar to output 175, etc.).

The components of characteristic dominated ring oscillator system 1300 cooperatively operate to transition a signal (e.g., transition a signal logic state, transition a signal voltage level, etc.). The ring oscillator 1302 is operable to cause at least one respective inversion transition in a signal. The signal transition is impacted by the respective target components selected by the programmable controller 1330. In one embodiment, the transition or propagation of the inversion in the signal through the ring oscillator is impacted (e.g., delayed, etc.) by the power voltage level supplied to the inversion components of the ring oscillator. In one exemplary implementation, the power voltage level supplied to the inversion components 1311, 1312, 1313 and 1314 is determined in part by the respective selection or activation of target components (e.g., 1321, 1322, 1323 and 1329, etc.). In one exemplary implementation, the programmable controller includes sleep transistors (e.g., 1331, 1332, 1333, and 1339, etc.) which are selectively enabled (e.g., by EN1, EN2, EN3, ENn, etc.). The voltage supplied to rail 1302 is determined by the voltage drop from rail 1301 caused by a selected target component. The voltage drop can be from VDD. In one embodiment, in a control mode (e.g., EN0 active, etc.) VDD is shorted to the inversion component.

In one embodiment, the target components (e.g., vias, contacts, etc.) include an increased or dominant resistive characteristic (e.g., increased via resistance, increased contact resistance, etc.). In one embodiment, the dominant characteristic of a target component (e.g., via resistance, contact resistance, etc.) has an increased or greater comparative impact or influence on a signal transition or propagation (e.g., timing, delay, etc.) through the ring oscillator. In one exemplary implementation, the increased impact influences the resulting output frequency. In one exemplary implementation, the greater or higher the resistance of a selected target component the lower the voltage supplied to the inverters and the slower the transition in the signal. In one embodiment, the current supplied is DC and there is no or minimal AC which eliminates or greatly reduces impacts associated with capacitance. In one exemplary implementation, including the target component impact in the power supply feed eliminates or greatly reduces impacts associated with other components ring oscillator component processes (e.g., ring oscillator inverter fabrication process impacts can be factored out, etc.).

Figure 14:
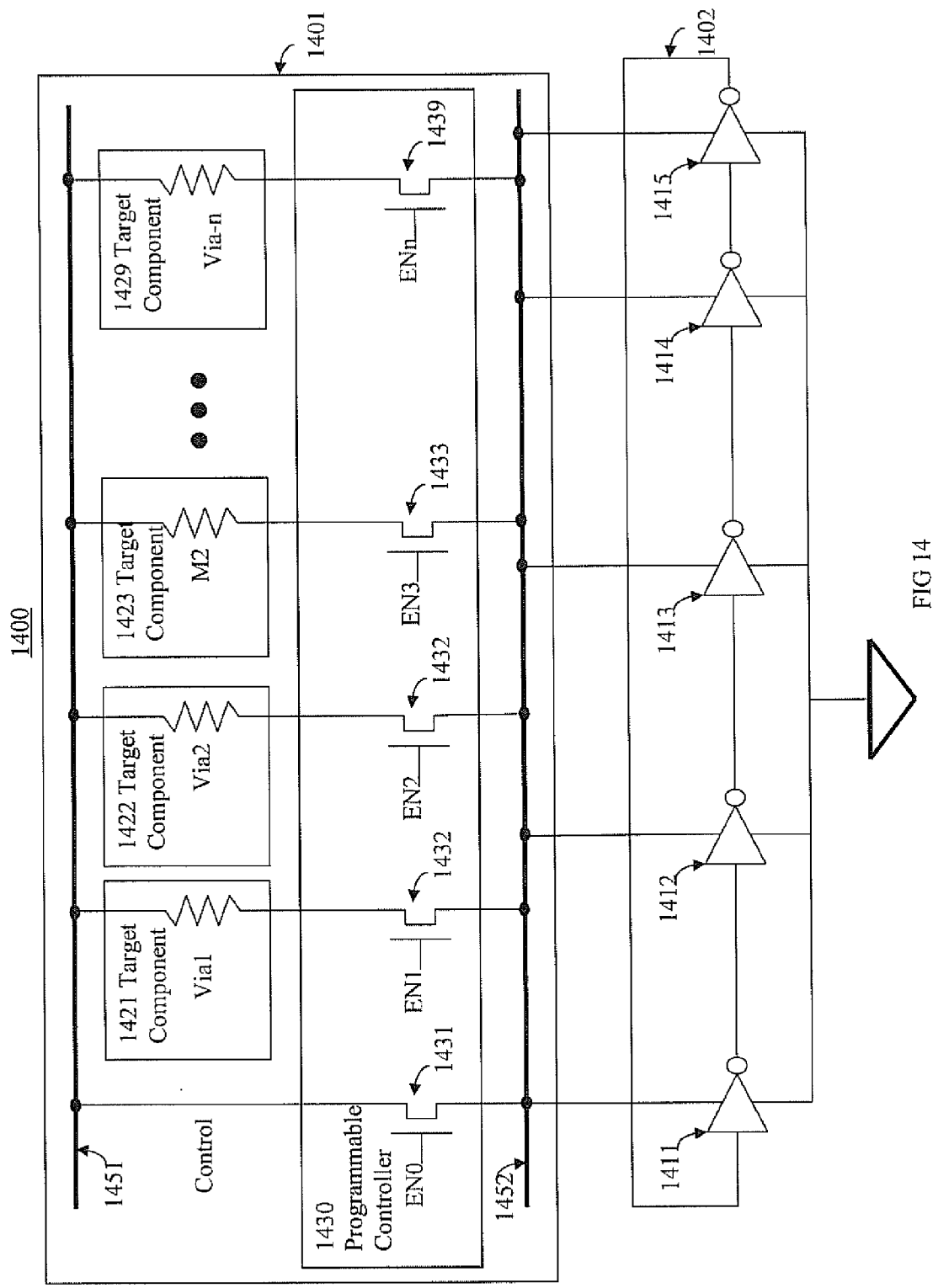
FIG. 14 is a block diagram of exemplary a characteristic dominated ring oscillator system in accordance with one embodiment of the present invention.

FIG. 14 is a block diagram of exemplary characteristic dominated ring oscillator system 1400 in accordance with one embodiment of the present invention. Characteristic dominated ring oscillator system 1400 is similar to characteristic dominated ring oscillator system 1300 except target component 1423 is a directed to a dominant characteristic of metal layer 2 instead of via layer 3. Characteristic dominated ring oscillator system 1400 includes power supply system 1401 and oscillating ring 1402. Power supply system 1401 includes rail 1451, target component 1421, target component 1422, target component 1423, target component 1429, programmable controller 1430 and rail 1452. Ring oscillator 1401 includes inversion components 1411, 1412, 1413, 1414 and 1415. In one exemplary implementation, the programmable controller includes sleep transistors (e.g., 1431, 1432, 1433, 1439, etc.) which are selectively enabled (e.g., by EN1, EN2, EN3, ENn, etc.). In one embodiment, ring oscillator 1402 can include a control component (not shown) is operable to control a state of the signal (e.g., similar to control component 140, etc.) and an output operable to output a signal (e.g., similar to output 175).

The impact of the target components on a signal transition (e.g., state change, propagation, etc.) can be a function of various characteristics or features of the target components. The target components can include various properties (e.g., resistance, capacitance, etc.) that are a function of characteristics or processes associated with the target component (e.g., can be a function of M2/Via2/M3 misalignment, of size, of spacing, of etching, of metal filling, of CMP, etc.).

In one embodiment, RO frequency correlates with Via/contact. The RO frequency and via contact can be a function of various things lithography overlay misalignment, etching, CMP, etc.). In one embodiment, lithography has a very characteristic signature. In one exemplary implementation, lithography is very layout dependent. A small shift in one layout can indicate very significant shift in another layout.

In one embodiment, target components can be configured to correspond to or be indicative of various characteristics or features (e.g., misalignment, flaws, errors, other effects, etc.). In one embodiment, layout or configuration of the components (e.g., via components, metal layer component etc.) in a via dominant resistive load is modified (e.g., change configuration, change width, change length, more lithographically sensitive, etc.) to make it more sensitive to various characteristics or features (e.g., misalignment, flaws, errors, other effects, etc.).

It is appreciated that a via type target component can include a variety of via resistance dominant characteristics (e.g., wide via, narrow via, numerous vias, etc.). In one exemplary implementation, if one type of RO with a particular sensitivity (e.g., narrow via enclosure, etc.) starts to deviate more strongly a determination can be made to attribute the deviation to a characteristic or feature (e.g., misalignment, flaws, errors, other effects, etc.) or whatever sensitivity the particular layout type has.

Figure 8:
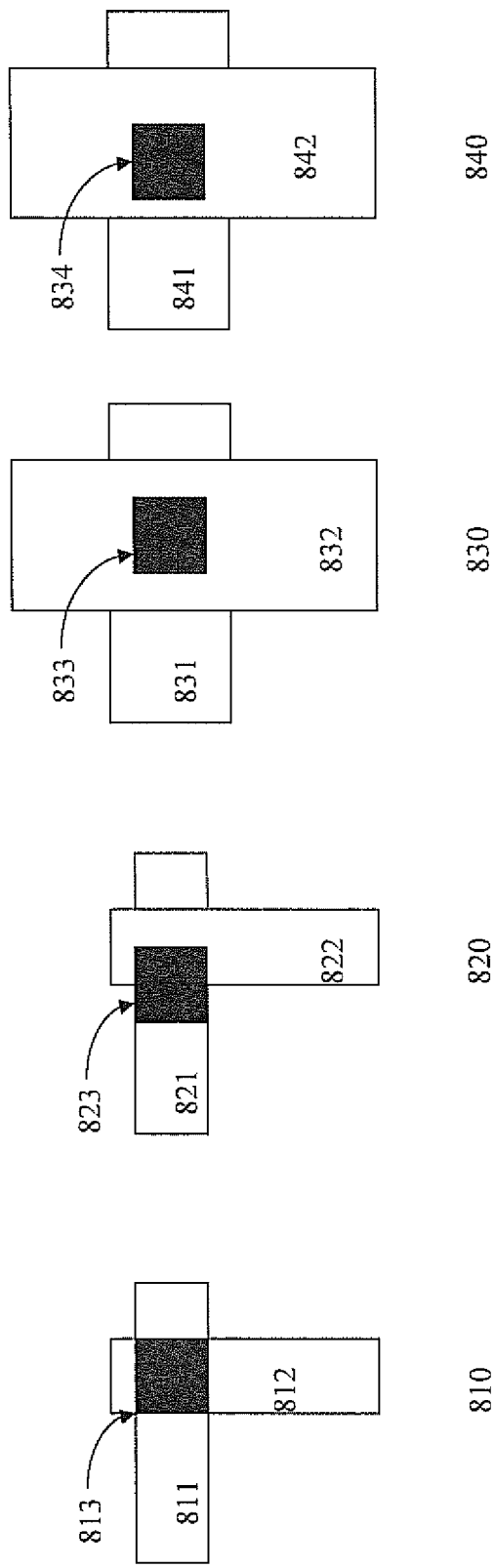
FIG. 8 is a block diagram of via resistance RO with different sensitivities to process variations in accordance with one embodiment of the present invention

FIG. 8 is a block diagram of via resistance RO with different sensitivities to process variations in accordance with one embodiment of the present invention. Configuration 810 indicates the first horizontal metal layer component 811, the second horizontal metal layer component 812 and the vertical via component 813 are configured to form a reduced coupling enclosure area. The reduced coupling enclosure area can be implemented for increased sensitivity to misalignment. Configuration 820 indicates that a shift in the vertical via component 823 moves the via outside or straddling the enclosure area and is not a good coupling of the first horizontal metal layer component 821 and the second horizontal metal layer component 822. Configuration 830 indicates the first horizontal metal layer component 831, the second horizontal metal layer component 832 and the vertical via component 833 are configured to form an enlarged coupling enclosure area. The enlarged coupling enclosure area can be implemented for reduced sensitivity to misalignment. Configuration 840 indicates that a shift in the vertical via component 843 does not move the via outside nor straddle the enclosure area and is still a reasonably good coupling of the first horizontal metal layer component 841, the second horizontal metal layer component 842. In one embodiment, the width of a via can be 50 nanometers and width of the metal component is 100 nanometers. In one exemplary implementation, the overhang of distance from the edge of a centrally located via to the edge or a metal layer is 50 nanometers.

In one embodiment, there are multiple via sensitive ROs with different sensitivities to process. In one exemplary implementation, a combination of ROs are examined for one via layer and the ROs help identify a root cause of problem. Programmable misalignment can be used to quantify the amount of misalignment.

In one embodiment, the target component is sensitive to critical dimension or size. In one exemplary implementation, there is a relatively smaller critical dimension on the bottom of a via and there is a relatively bigger critical dimension on the top of a via The results of the RO output can be utilized as a fabrication process monitor. In one embodiment, the results are in a convenient digital form. The process monitoring can also be conveniently performed on various levels of granularity (e.g., per component, per chip, per wafer, etc.) and various types of failures (e.g., CP, FT, etc.). There can also be multiple test points or regions within a mask. The via and contact resistance changes can be used to estimate via and contact failure rates. In one embodiment, this can be done by having a minimum of one instance per chip and optimally more. In one exemplary implementation, some wafer level variation can be expected due to sheet resistance changes as well as etcher variation, but with a higher density of points, reticle or mask (lithography) level systematic can be identified.

Figure 5:
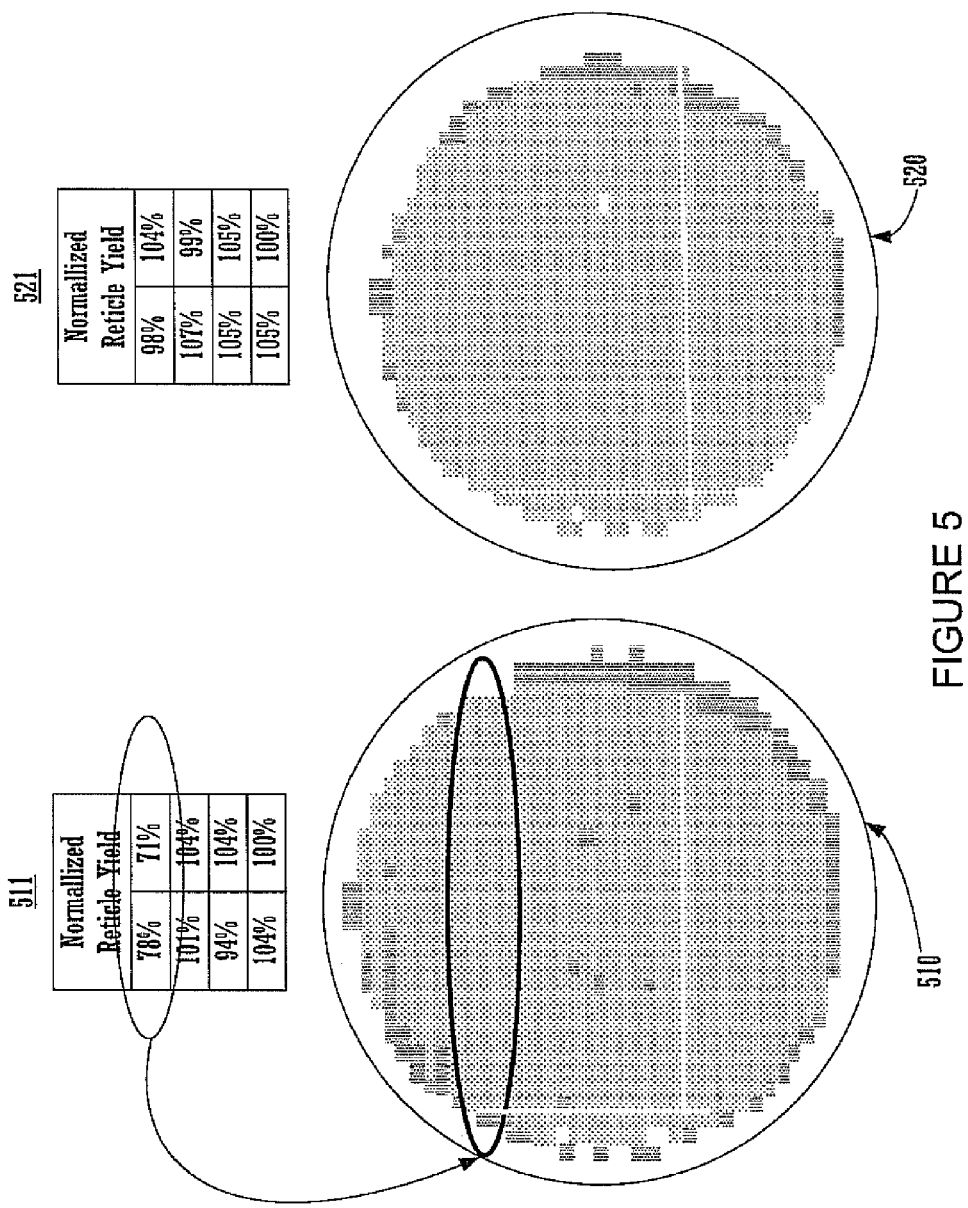
FIG. 5 is a block diagram of a wafer map in accordance with one embodiment of the present invention.

With these results a wafer map can be used to detect resistance discontinuities at the wafer level. FIG. 5 is a block diagram of a wafer map in accordance with one embodiment of the present invention. In graph 510 a strong striped pattern is shown. The table 511 indicates the top two chips have a 30% lower yield. In graph 510 a no or weak striped pattern is shown. Table 521 indicates 8 chips per reticle. In one embodiment, no other Via 2 test structure exists in every chip in the wafer.

Figure 6:
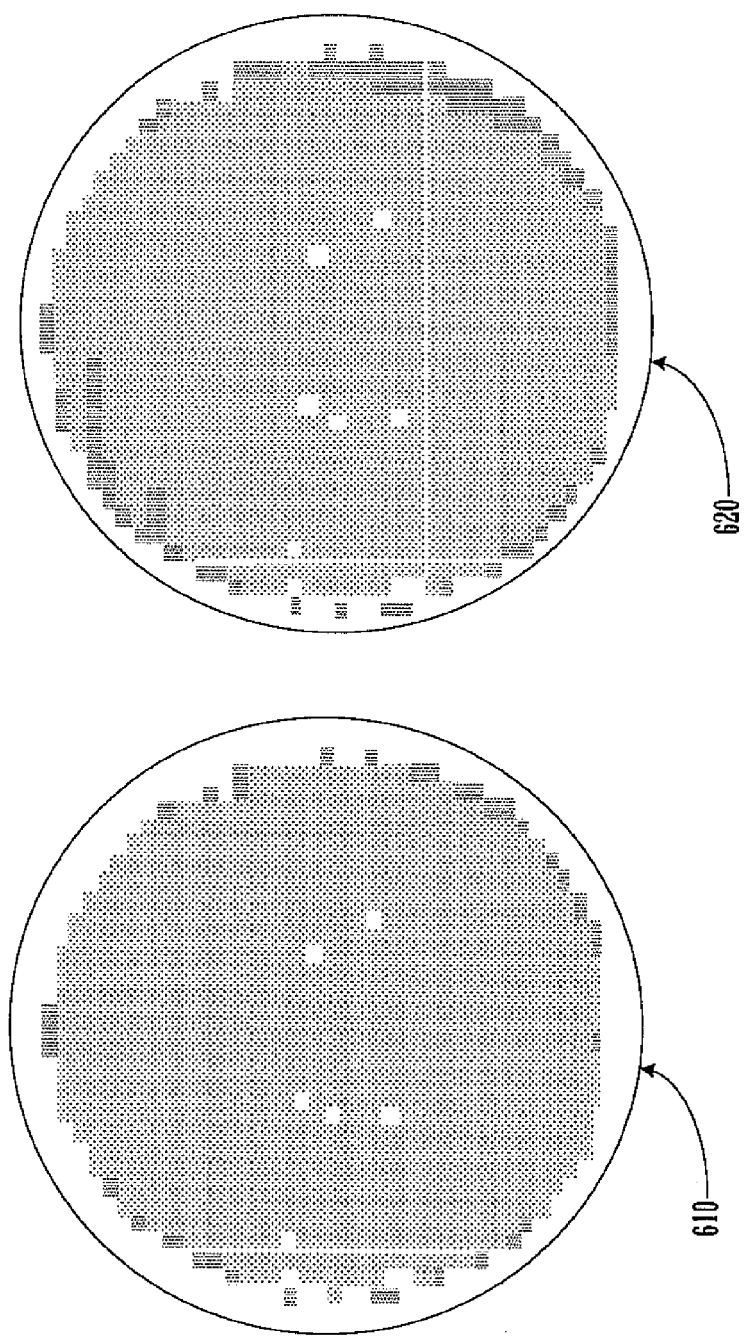
FIG. 6 is a block diagram of a different via layer comparison map in accordance with one embodiment of the present invention.

In one embodiment, even small changes in via resistance can form very noticeable patterns that can then be correlated to low yielding chips. Significant yield differences can then be used to extrapolate increased via failure rates. Hence correlating chip failure to discontinuities in via resistance across the wafer can be another tool for identifying yield detractors. In one embodiment, having at least one separate RO with a high via/contact resistance to inverter stage transistor resistance for a via and contact layer enables insight into via and contact layers that have a RO. Averaging multiple via/contact types or levels can also be used to subtract out wafer level signatures that reduce the existence of lithography driven defects. Finally bring up teams can also be focused on new issues as chips with higher via failure rates can be ignored. Process improvements can also be tracked and quantified in more metrics or greater granularity than just yield (e.g., via 2 resistance, indication of cause of yield problem, etc.). FIG. 6 is a block diagram of a different via layer comparison map in accordance with one embodiment of the present invention. Graph 610 is for a Via 3 target component dominate ring oscillator. Graph 620 is for a Via 2 target component dominate ring oscillator. In one embodiment the same RO in same locations except with Via 3 dominated resistive load.

Figure 7A:
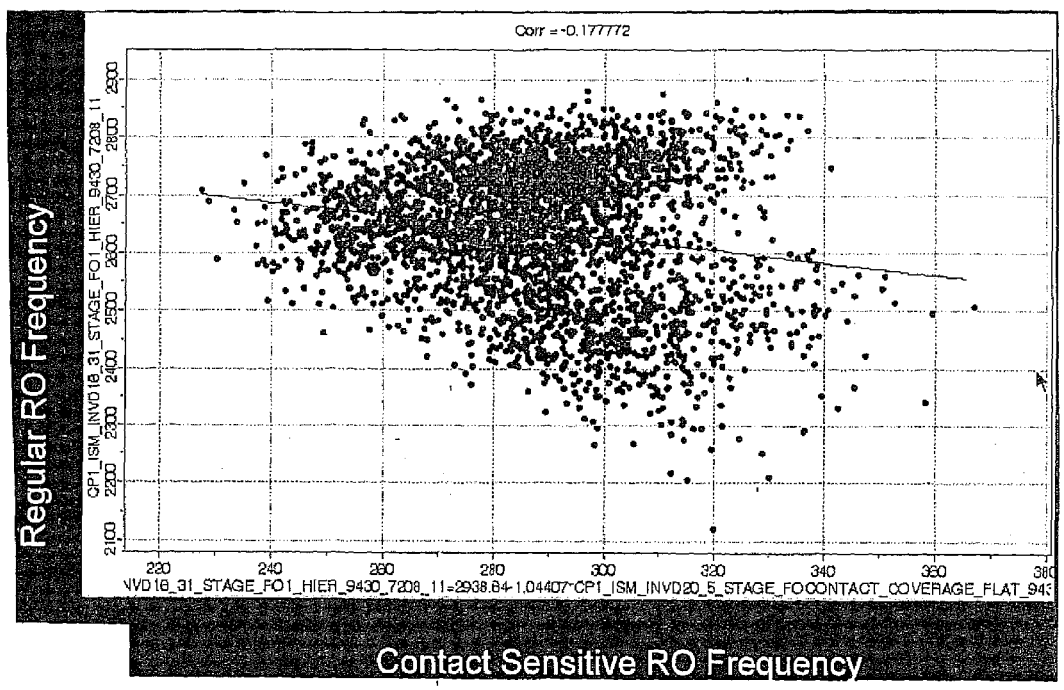
FIG. 7A is a graphical indication a lack of correlation with transistor speed in accordance with one embodiment of the present invention.
Figure 7B:
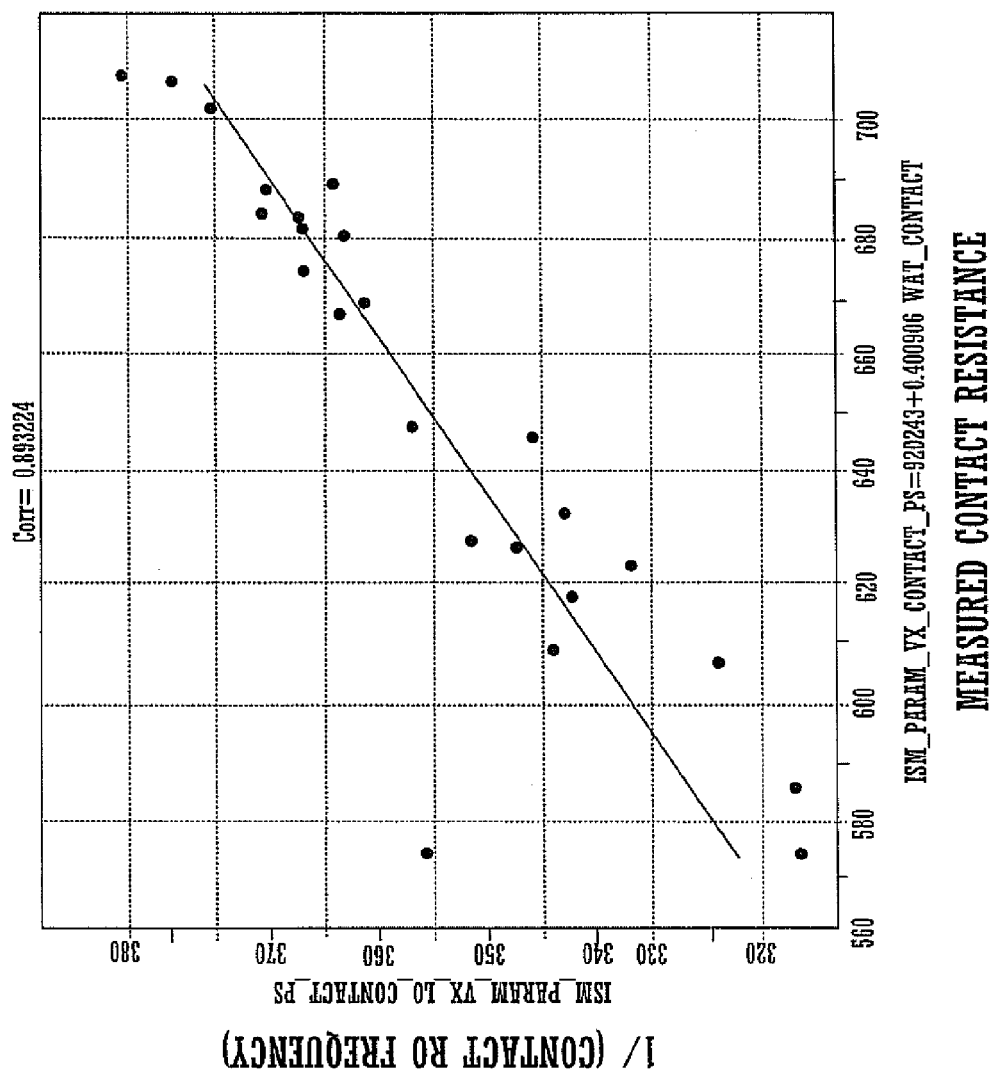
FIG. 7B is a block diagram of a graphical indication of a high correlation with measure resistance.

FIG. 7A is a graphical indication a lack of correlation with transistor speed in accordance with one embodiment of the present invention. In one embodiment, the goal is measure contact resistance an not transistor speed. FIG. 7B is a block diagram of a graphical indication of a high correlation with measure resistance. In one embodiment, there is a strong correlation with contact resistance measured with a four point probe.

It is appreciated while the present description is often described in terms of via resistances a variety of resistances can also be analyzed (e.g., via resistance, contact resistance, etc.) to facilitate process monitoring. In one exemplary implementation, delay or transistor speed is translated into a digital value by a ring oscillator to increment a counter for a fixed period of time. The digital counter results can be read out by a variety of mechanisms (e.g., a scan chain, JTAG chain, etc.). Hence, ring oscillator (RO) frequencies can be very inexpensively measured on a high volume ATE tester as compared to traditional mechanism attempts.

Figure 9:
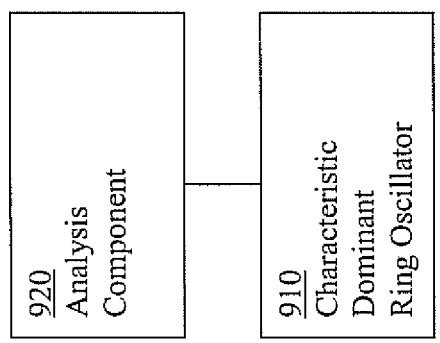
FIG. 9 is a block diagram of exemplary analysis system in accordance with one embodiment of the present invention.

FIG. 9 is a block diagram of exemplary analysis system 900 in accordance with one embodiment of the present invention. Analysis system 900 includes characteristic dominant ring oscillator system 910 and analysis component 920. It is appreciated that the characteristic dominant ring oscillator system 910 can include a variety of implementations 200, 1300, 1400, etc.). Characteristic dominant ring oscillator 910 can include at least one target component (e.g., 121, 221, 1321Z21, etc.). Characteristic dominant ring oscillator dominant 910 can include at least one control component (e.g., 140, 230, etc.). It is also appreciated that analysis component 920 can include a variety of implementations. In one embodiment, an output of characteristic dominant ring oscillator 910 is fed into analysis component 920. The analysis component 920 can include components on chip with the characteristic dominant ring oscillator 910, components off chip from the characteristic dominant ring oscillator 910, combination of components on and off chip. It is also appreciated that the analysis component 920 can perform a variety of different analysis. In one exemplary implementation, the analysis can include transition delays, determination of resistance power consumption, manufacturing process compliance and defects, etc.

Figure 10:
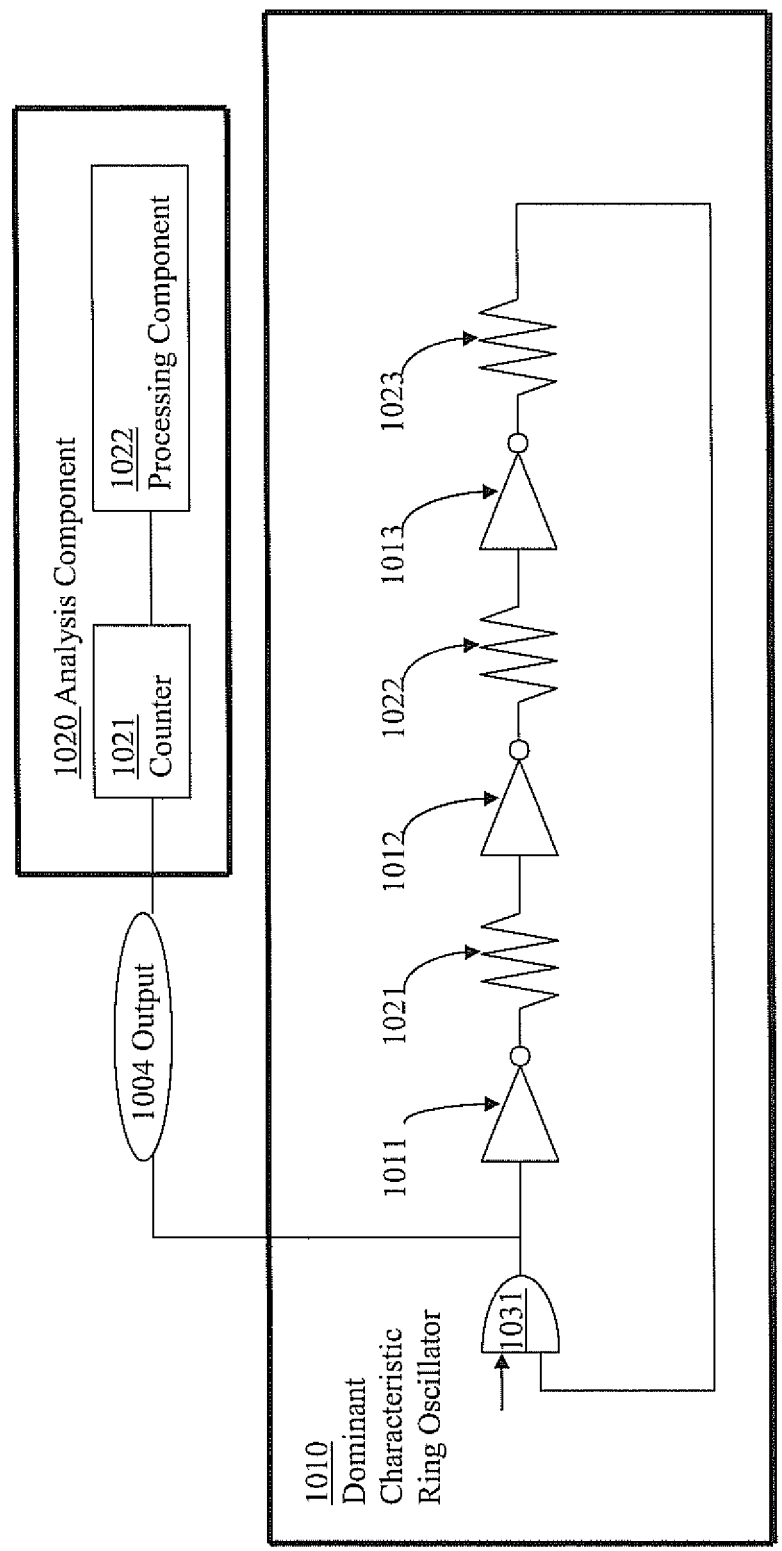
FIG. 10 is a block diagram of exemplary analysis system in accordance with one embodiment of the present invention.

FIG. 10 is a block diagram of exemplary analysis system 1000 in accordance with one embodiment of the present invention. Analysis system 1000 includes dominant characteristic ring oscillator 1010 and analysis component 1020. Dominant characteristic ring oscillator 1010 includes an oscillating ring comprising inversion components 1011, 1012, 1013, target components 1021, 1022, 1023, and controller 1031 coupled in a ring path. Output 1004 is forwarded from dominant characteristic ring oscillator 1010 to analysis component 1020. Analysis component 1020 includes counter 1021 and processing component 1022. It is also appreciated that the analysis component 1020 can perform a variety of different analysis. In one exemplary implementation, the analysis can include transition delays, determination of resistance power consumption, manufacturing process compliance and defects, etc.

FIG. 11 is a flow chart of exemplary analysis method 1100 in accordance with one embodiment of the present invention. In one embodiment, analysis method 1100 is performed by an analysis component (e.g., 920, 1020, etc.).

In block 1110, a dominate characteristic ring oscillation process is performed. In one embodiment, the dominant characteristic ring oscillation process includes pull ups and pull downs of a signal wherein at least one transition of a signal inversion to a subsequent component is impacted by a dominate characteristic. The dominant characteristic can be associated with a target component characteristic. In one exemplary implementation, oscillation includes transitions between a logical 1 state to a logical 0 state. In one embodiment, the second logic state is the opposite or inverse of the first logic state. In one embodiment, a dominant characteristic impact (e.g., via resistance, contact resistance, etc.) increases or makes the transition propagation delay longer or greater than would otherwise take if the dominant characteristic was not impacting the transition. In one embodiment, the resulting delay is so large it dominates the ring oscillator frequency. In one exemplary implementation, the delay can be digitally measured.

In block 1120, an analysis process is performed. In one embodiment, results of the dominate characteristic via ring oscillation process (e.g., similar to block 1110, etc.) are analyzed. It is appreciated that a variety of different analysis can be performed. The analysis can give insight into various characteristics and features (e.g., metal via resistance and configuration, contact resistance and configuration, etc.) that can be used to improve process as well as improve process modeling. Significant deviation in any component (e.g., via layer, contact layer, metal layer, etc,) can be fed back to the process team. Getting this information from ring oscillators enables high volume data collection across many production lots, which facilitates more accurate statistical analysis of various issues (e.g., process drift, malfunctions, operation difficulties, etc.).

FIG. 12 is a flow chart of exemplary analysis process 1200 in accordance with one embodiment of the present invention. In one exemplary implementation, analysis process 1200 is similar to the analysis process of block 1120. In one exemplary implementation, analysis process 1200 is similar to the analysis performed by an analysis component (e.g., 920, 1020, etc.).

In block 1210, an indication associated with a dominant characteristic is received. In one embodiment, the indication includes transitions in a signal in which at least one transition delay is impacted by a dominant characteristic.

In block 1220, a timing characteristic associated with a signal transition delay time is determined, wherein the timing transition delay time is impacted by a dominant characteristic. In one embodiment, the timing characteristic is a delay in a signal transition from one component to another component. It is appreciated that a timing characteristic transition delay can be impacted by a variety of dominant characteristics (e.g., via resistance, contact resistance, high channel resistance, low channel resistance, high coupling capacitance, low coupling capacitance, etc.).

In block 1230, characteristics of a device are analyzed based upon the signal transition timing. In one embodiment the transition timing analysis includes analysis of a delay in a signal transition from one component to another component. It is appreciated that a variety of characteristics can be analyzed. In one embodiment, analysis of various component characteristics (e.g., metal layer characteristics, via layer characteristics, contact characteristics, etc.) is performed. The target components can include various properties (e.g., resistance, capacitance, etc.) and characteristics or processes associated with the target component properties or sensitivities (e.g., can be a function of M2/Via2/M3 misalignment, of size, of spacing, of etching, of CMP, etc.) can be analyzed. Various items can be analyzed at a various levels (e.g., chip level, wafer level, systematic level, etc.). Various statistical analysis (e.g., averaging. etc.) can be performed to factor out anomalies (e.g., wafer level signatures, etc.). In one embodiment, if dominate characteristic ring oscillator system has a particular characteristic (e.g., 100,000 vias in a target component and a 10% increase in resistance, etc.) then various extrapolation can be made (e.g. there will be a via failure in 1,000,000 vias, etc.).

In one exemplary implementation, the signal transition timing delay times can be utilized to examine fabrication processes and device operations. The transition delays can be utilized to extrapolate resistance measurements and coupling capacitance measurements for both components included in an oscillating ring and other components of a semiconductor chip. The other components can include components in an area of a semiconductor chip close to components or with similar characteristics of components of a dominant character ring oscillator (e.g., 100, 200, etc.). In one exemplary implementation, measurements associated with a dominant characteristic (e.g., via resistance, contact resistance, line metal resistance, etc.) of ring oscillators is extrapolated based upon transition delays in the ring oscillators. The measurements can be extrapolated to analysis and measurement of metal layer characteristics of other components (e.g. arithmetic logic units, registers, etc.) of a semiconductor chip in addition to the ring oscillators.

In one embodiment, the analysis includes determining a delay associated with a dominate via resistance and the delay can be correlated to a process variation. The analysis can include deconvolving the via resistance, flaws, etc. In one embodiment, characteristics of a device are analyzed based upon the transition delay time. It is appreciated that a variety of characteristics can be analyzed. In one embodiment results from a ring oscillator including a resistance dominated via are compared to a spice simulation of the circuit. If the actual physical implementation is running faster then it is an indication the resistance is higher than expected. In one embodiment, a dominant characteristic ring oscillator system can be utilized to identify catastrophic failures (e.g., an open or infinite resistance, a excessive delay on a critical path, etc.). In one embodiment, a dominant characteristic ring oscillator system can be utilized to identify soft failures (e.g., a particular resistance, a delay on a non-critical path, etc.).

In one embodiment, analysis results indicates various conclusions. The systematic reticle level pattern is definitely mask/litho related. Slight via 2 resistance increase indicates a M2/Via 2 misalignment issue. The M2/Via2 misalignment issue in turn indicates a significant increase via 2 failure rate. The top dies parts that pass CP/Ft may have undetectable high resistance vias that impact system speed. In one exemplary implementation, the analysis facilitates reducing or avoiding wasted time figuring out speed issue when chances are significantly higher that process can be a source of the problems. In one embodiment, analysis can be direct to lithograhic lens issues by making target component sensitive to lithographic pattern issues (e.g., trifoil, de-focus, chroma, higher order aberrations, etc.).

Characteristic dominated ring oscillator systems and methods facilitate convenient and efficient analysis of various characteristics and features. In one embodiment, characteristic dominated ring oscillator systems and methods can enable measurement of information associated with the various characteristics and features utilizing fewer resources (e.g., 100-200 vias, 1000-2000 vias, etc.) than conventional approaches (e.g., 500,000 vias, 1,000,000 vias, etc.). In one exemplary implementation, the information is retrieved in convenient digital format. In one embodiment, greater amounts of information at greater granularity can be retrieved at a lower cost and utilizing fewer resources than a traditional approach (e.g., more measurement "points" can be included on a die, much less die area and resources are occupied, etc.). The increased amount and granularity (e.g., directed to particular area of die, directed to particular process sensitivity, etc.) can be utilized for improved analysis of potential problems.

It is appreciated that a dominant characteristic can be a characteristic that has a detectable impact on signal transition or propagation through a ring oscillator. The dominant characteristic can be dominant in an absolute sense or may be dominant in a relative sense on the detectable impact. In one embodiment, the target component resistance (e.g., is not more dominant in an absolute sense than a second other component (e.g., inverter, controller, etc.) and if the second other component resistance is not altered, a change in the target component resistance has a dominant or detectable impact on the change in a transition or propagation of a signal transition since the other component resistance is not altered. In one embodiment, where via resistance (e.g., 10 ohms, 100 ohms, etc.) is less than resistance of another component (e.g., 1000 ohms, 3000 ohms. etc.) in an absolute sense, if the via resistance is changed (e.g., 20 ohms, 300 ohms, etc.) and the other component resistance is not changed then the via resistance has a dominant impact on the resulting change in signal transition delay. While the "dominant" characteristic of target components in many of the presented examples 121, 122 and 123 in the present example is resistance, it is appreciated that the "dominant" characteristic of a target component can include various characteristics (e.g., impedance, capacitance, inductance, etc.).

Presented systems and methods facilitate convenient and efficient analysis. It is appreciated the target components can consume less resources and produce more useful information than conventional approaches. For example, additional components (e.g., vias, contacts, etc.) added in present approaches (e.g., 1000 to 2000, 100-200, etc.) can be significantly less and more efficient then extremely large number of vias (e.g., 500,000, million, etc.) included in some conventional approaches. In one embodiment, components associated with presented systems and methods can be granularly implemented (e.g., consume relatively small die area, placed relative close to die components, etc.). Results from granular implementation can be extrapolated to other components in the die (e.g., fabrication issues, operation issues, etc.). The presented systems and methods also readily provide digital information that can be utilized in various processing analysis.

Portions of the detailed description are presented and discussed in terms of a method. Although steps and sequencing thereof are disclosed in figures herein describing the operations of this method, such steps and sequencing are exemplary. Embodiments are well suited to performing various other steps or variations of the steps recited in the flowchart of the figure herein, and in a sequence other than that depicted and described herein.

Presented systems and methods facilitate convenient and efficient analysis. It is appreciated the target components can consume less resources and produce more useful information than conventional approaches. For example, additional components (e.g., vias, contacts, etc.) added in present approaches (e.g., 1000 to 2000, 100-200, etc.) can be significantly less and more efficient then extremely large number of vias (e.g., 500,000, million, etc.) included in some conventional approaches. In one embodiment, components associated with presented systems and methods can be granularly implemented (e.g., consume relatively small die area, placed relative close to die components, etc.). Results from granular implementation can be extrapolated to other components in the die (e.g., fabrication issues, operation issues, etc.). The presented systems and methods also readily provide digital information that can be utilized in various processing analysis.

Some portions of the detailed description are presented in terms of procedures, steps, logic blocks, processing, and other symbolic representations of operations on data bits that can be performed within a computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components Some embodiments may be described in the general context of computer-executable instructions, such as program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

Computing devices can include at least some form of computer readable media. Computer readable media can be any available media that can be accessed by a computing device. By way of example, and not limitation, computer readable medium may comprise computer storage media and communication media. Computer storage media includes volatile and nonvolatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, or any other medium which can be used to store the desired information and which can be accessed by a computing device. Communication media typically embodies computer readable instructions, data structures, program modules, or other data in modulated data signals such as carrier waves or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A ring oscillator comprising:
at least one inversion stage operable to cause a signal transition; wherein said inverting stage is coupled to another component through a via layer in which a resistance due to characteristics of the via layer coupling has a relatively significant impact on a transition of a signal through a ring path, wherein the coupling through the via layer is configured to facilitate misalignment analysis, including distinguishing whether the impact is due to misalignment or not; and
an output component for outputting an indication of the impact the via resistance has on the signal transition of the signal through the ring oscillator.

2. A ring oscillator of claim 1 in which the coupling through the via layer includes a first horizontal metal layer component at one level and a second horizontal metal layer component at another level and a vertical component coupling the first horizontal metal layer component at one level and a second horizontal metal layer at another level.

3. A ring oscillator of claim 2 wherein the first horizontal metal layer component, the second horizontal metal layer component and the vertical component are configured to form a reduced coupling enclosure area for increased sensitivity to misalignment.

4. A ring oscillator of claim 2 wherein the first horizontal metal layer component, the second horizontal metal layer component and the vertical component are configured to form an enlarged coupling enclosure area for reduced sensitivity to misalignment.

5. A ring oscillator of claim 2 wherein the vertical component is wide compared to the first horizontal component and second horizontal component.

6. A ring oscillator of claim 2 wherein the vertical component is narrow compared to the first horizontal component and second horizontal component.

7. A ring oscillator of claim 1 wherein the via resistance is significantly higher than the channel resistance of a driving transistor.

8. A method comprising:
performing a dominant characteristic ring oscillation process, wherein a dominant characteristic facilitates via misalignment-analysis, including distinguishing whether the impact is due to misalignment or not; and
analyzing results of the dominant characteristic ring oscillation process, including analyzing misalignment.

9. The method of claim 8 wherein the analysis includes determining a delay associated with a via resistance characteristic of dominant via resistance ring oscillation process.

10. The method of claim 8 wherein the analysis includes correlating a delay associated with at least one of a dominant via resistance characteristic oscillation rings to a process variation.

11. The method of claim 8 wherein the analysis includes deconvolving transistor speed.

12. The method of claim 8 wherein the analysis includes deconvolving metal resistance.

13. The method of claim 8 wherein the analyzing comprises:
examining large enclosure ring oscillator where via resistance plays a relatively very small role in delay;
examining small enclosure ring oscillator where via resistance plays a relatively very large role in delay; and
determining the via resistance difference due to via discontinuity.

14. A ring oscillator comprising:
at least one inversion stage operable to cause a signal transition;
a target component that has an increased comparative impact or influence on a signal transition propagation in the ring oscillator, wherein the target component facilitates via misalignment analysis, including distinguishing whether the impact is due to misalignment or not; and
an output component for outputting an indication of the impact the target component has on the signal transition.

15. A ring oscillator of claim 14 wherein the target component includes a plurality of vias from one metal layer to another metal layer.

16. A ring oscillator of claim 15 wherein the plurality of vias from one metal layer to another metal layer are configured in a cell.

17. A ring oscillator of claim 14 wherein vias corresponds to a via layer.

18. The ring oscillator of claim 14 wherein the output is coupled to an analysis component.

19. A ring oscillator of claim 14 wherein an analysis component can include correlation of a via resistance into a wafer variations and generate a wafer map.

20. The ring oscillator of claim 14 further comprising a control component coupled to the ring path to control a state of the signal.

* * * * *